United States Patent [19]
Herrick

[11] Patent Number: 5,278,351
[45] Date of Patent: Jan. 11, 1994

[54] PERSONAL COMPUTER CABINET COVER WITH EMI CLIPS

[75] Inventor: Gregory E. Herrick, Minneapolis, Minn.

[73] Assignee: Zeos International, Inc., Minneapolis, Minn.

[21] Appl. No.: 864,796

[22] Filed: Apr. 7, 1992

Related U.S. Application Data

[63] Continuation of Ser. No. 679,262, Apr. 2, 1991.

[51] Int. Cl.$^5$ .............................................. H05K 9/00
[52] U.S. Cl. .................................. 174/35 R; 174/51; 361/683; 361/818
[58] Field of Search ..... 174/35 R, 35 MS, 50, 51, 52.1; 220/4.01, 4.02; 219/10.55; 361/424, 380, 390, 391, 394

[56] References Cited

U.S. PATENT DOCUMENTS

| | | | |
|---|---|---|---|
| 4,381,421 | 4/1983 | Coats et al. | 174/35 |
| 4,404,617 | 9/1983 | Ohyama et al. | 361/424 |
| 4,430,520 | 2/1984 | Tibbetts et al. | 174/35 |
| 4,631,641 | 12/1986 | Brombal et al. | 361/424 |
| 4,697,044 | 9/1987 | Ishikawa | 174/35 |
| 4,701,801 | 10/1987 | Hobbins et al. | 353/245 |
| 4,717,990 | 1/1988 | Tugcu | 361/424 |
| 4,916,578 | 4/1990 | Mast | 361/424 |
| 4,964,017 | 10/1990 | Jindricke et al. | 361/390 |

Primary Examiner—Leo P. Picard
Assistant Examiner—Bot Ledynh
Attorney, Agent, or Firm—Hugh D. Jaeger

[57] ABSTRACT

A personal computer cabinet with a cabinet base, an integral rear panel, a front panel, and two upwardly extending lips from the base. A cabinet cover engages with the front panel, the rear panel and includes two clips which engage with the lips of the base to negate or minimize any electromagnetic interference radiations from the electrical components inside a computer housing. These electrical components include the crystal oscillator, the microprocessor, and any other switching components.

5 Claims, 7 Drawing Sheets

PERSONAL COMPUTER CABINET COVER WITH EMI CLIPS

CROSS REFERENCES TO CO-PENDING APPLICATIONS

This patent application is a continuation of U.S. Ser. No. 07/679,262, filed Apr. 2, 1991, entitled "Personal Computer with Cabinet Cover EMI Clips", to the same assignee.

BACKGROUND OF THE INVENTION

1. Field of the Invention

The present invention relates to personal computers, and more particularly, pertains to reducing or eliminating electromagnetic interference or radio frequency interference emissions from the electrical components inside the housing or cabinet of the personal computer.

2. Description of the Prior Art

Prior art personal computers have been known for radio frequency emissions which cause interference. Cabinets generally have been considered leaky for EMI emissions or RFI emissions. The prior art cabinets were generally sheet metal structures which were minimally secured together, lacking in EMI (electromagnetic interference) and RFI (radio frequency interference) considerations. Corners and edges of the cabinets generally had minute gaps which allowed the leakage of EMI signals and RFI signals which did not meet part 15 of the FCC Rules and Regulations as promulgated under the 1934 Communications Act as amended.

The present invention overcomes the disadvantages of the prior art by providing a personal computer housing which negates and minimizes any EMI and RFI emissions.

SUMMARY OF THE INVENTION

The general purpose of the present invention is a personal computer cabinet with a cabinet cover with EMI clips for engaging with the base of the personal computer for negating and minimizing EMI and RFI emissions.

According to one embodiment of the present invention, there is provided a personal cabinet with a cover, including EMI clips for engaging with lips on the base of the personal computer cabinet. The clips form EMI and RFI seals between the cover of the personal computer cabinet and the base of the personal computer cabinet.

Significant aspects and features of the present invention include a personal computer cabinet which includes EMI and RFI shielding through the use of cover clips to engage with lips of the base, providing an EMI and RFI shield. The clips between the cover and the base negate, or at the very least minimize EMI and RFI emissions.

Having thus described the embodiments of the present invention, it is the principal object hereof to provide a personal computer with clips between the metal components to negate or minimize EMI and RFI emissions.

One object of the present invention is to provide a personal computer cabinet with a cabinet cover which engages a base, where the cabinet cover includes internal clips to engage with lips on the base for providing an EMI and RFI shield for negating and minimizing EMI and RFI emissions.

Another object of the present invention is to provide a securely interlocking metallic enclosure that comprises only two members.

Yet another object of the present invention is to achieve a cabinet with all interlocking arrangements internal, so that the external appearance of the cabinet is an aesthetically pleasing and smooth orthogonal parallelepiped.

Another object is to secure all interlocking elements by means of screws at the rear panel of the cabinet only.

Another object is to achieve easy, smooth and simple disassembly of the cabinet by merely removing screws from a single cabinet surface, namely the rear surface.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
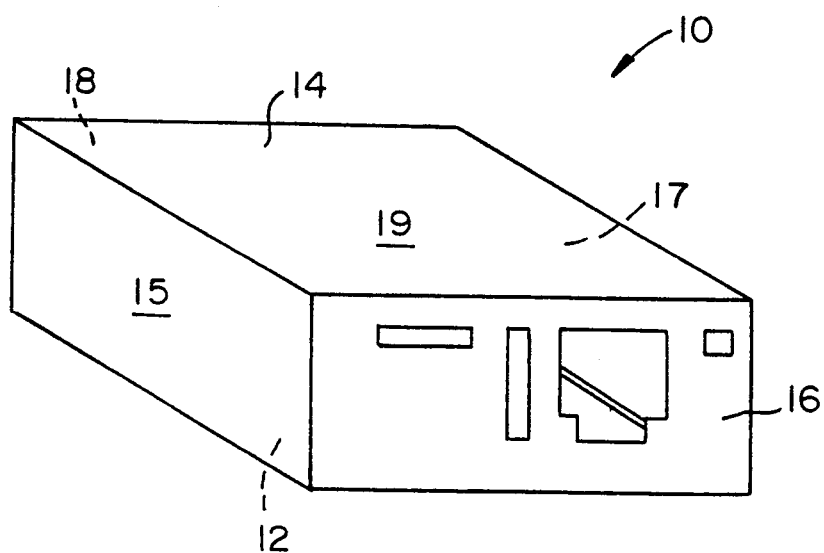
FIG. 1 illustrates a perspective view of a cabinet for a personal computer.

FIG. 1 illustrates a perspective view of a cabinet 10 for a personal computer including a base 12, cover 14, a front panel 16 and a rear panel 18. A polymer front face (not illustrated) can secure over and about the front panel 16.

Figure 2:
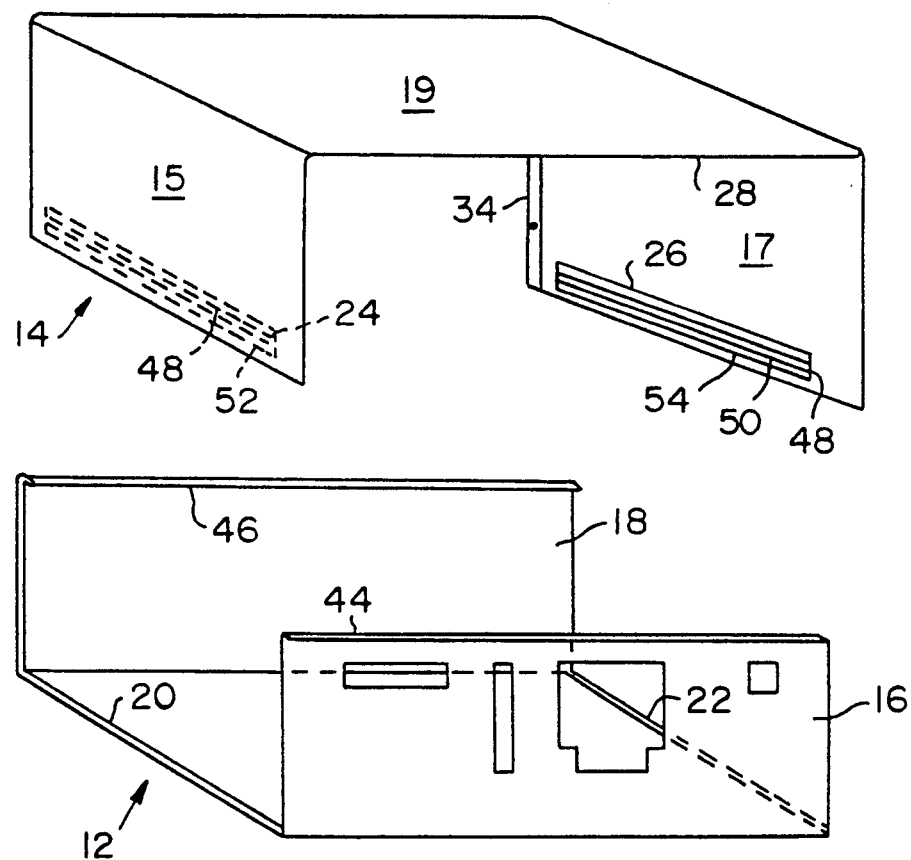
FIG. 2 illustrates a perspective view of the base and cover separated.

FIG. 2 illustrates a perspective view of the base 12 and cover 14 separated where all numerals correspond to those elements previously described. Particularly illustrated are the lips 20 and 22 of the base 12 which extend upwardly at a substantially right angle with respect to the base 12. Each front panel 16 and rear panel 18 include horizontal inwardly extending lips 44 and 46 at a right angle to the front and rear panels 16 and 18, respectively. Spring channel clips 24 and 26, which are suitably welded to the opposing inner lower sides 15 and 17 of the cabinet cover 14, extend downwardly so as to engage with the lips 20 and 22 of the base 12. The spring channel clips 24 and 26 include inner bends 48 and 50 to provide engagement and spring action on lower lips 52 and 54 of the spring channels 24 and 26. A top spring channel clip 28 secures on the underneath of the top surface 19 of the cover 14 is later described in FIG. 6. Channel spring clips 24 and 26 are continuous members, but may be of a discontinuous nature to include a series of aligned channels as required.

Figure 3:
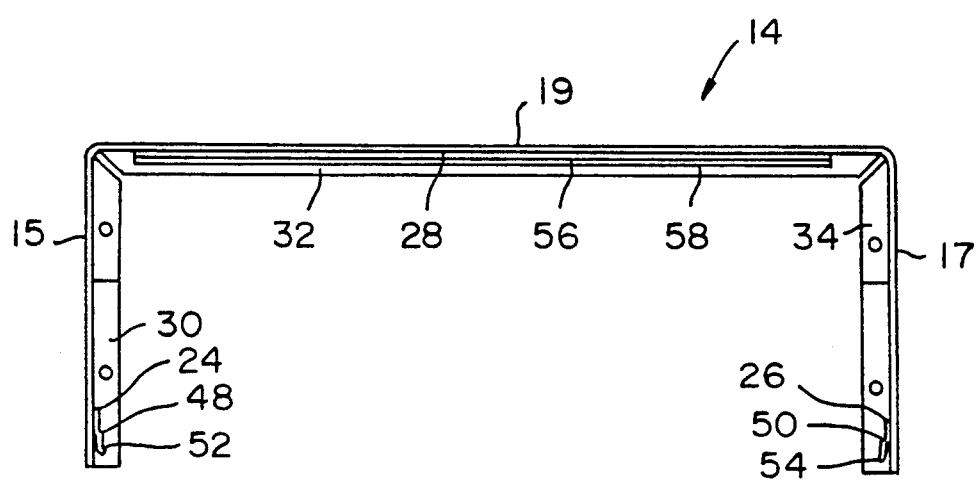
FIG. 3 illustrates a front view of the cabinet cover.

FIG. 3 illustrates a front view of the cabinet cover 14 where all numerals correspond to those elements previously described. Particularly illustrated is the top spring channel clip 28 secured to top planar member 19 for engaging the front lip 44 of the base 12, which includes an inner bend 56 and lower lip 58. The rear of the cabinet includes edges 30, 32 and 34 which mate against the rear panel 18 and are secured thereto by appropriate fasteners.

Figure 4:
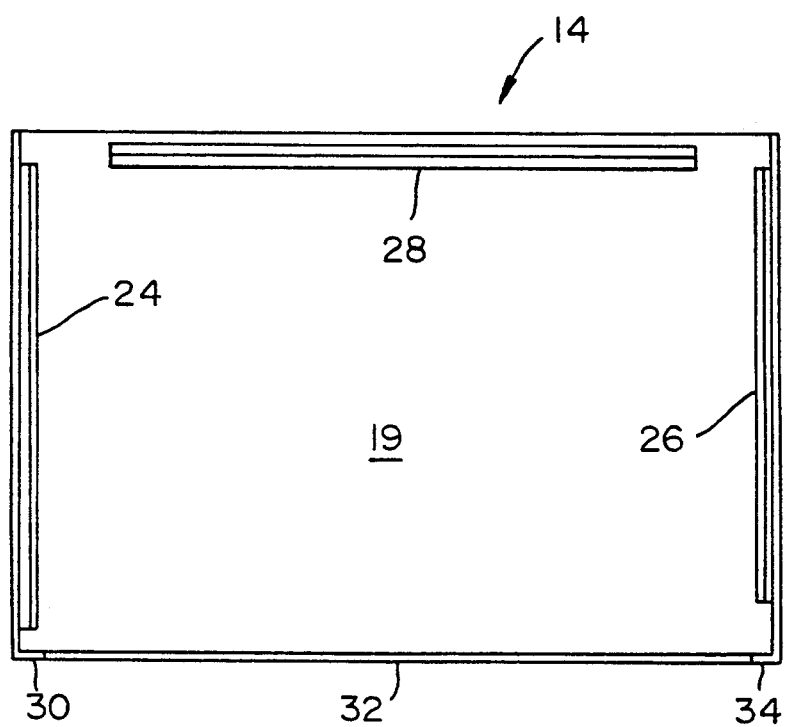
FIG. 4 illustrates a bottom view of the cabinet cover.

FIG. 4 illustrates a bottom view of the cover 14 where all numerals correspond to those elements previously described.

Figure 5:
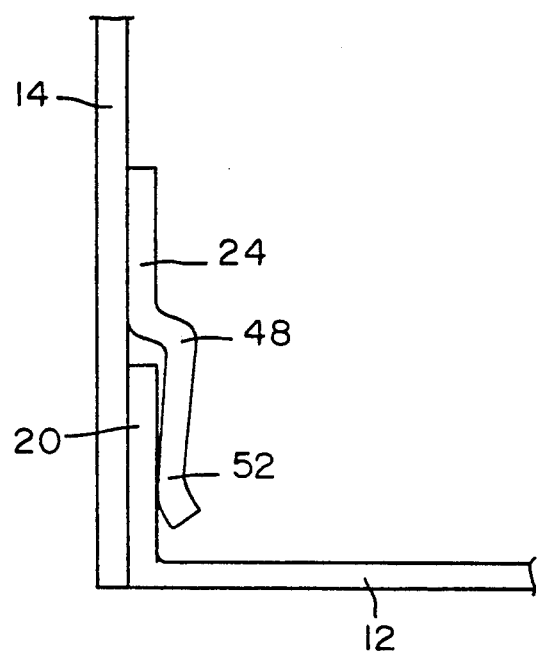
FIG. 5 illustrates a base lip engaging a spring channel clip.

FIG. 5 illustrates the lip 20 frictionally engaging the spring channel clip 24 where all numerals correspond to those elements previously described. The spring channel clip 24 forcefully engages over and about the lip 20 causing positive and continuous metal-to-metal physical and electrical contact between the base 12 and the cover 14. A similar frictional engagement is accomplished between the top spring channel clip 28 of the cover 14 and the lip 44 of the front panel 16 and as illustrated in FIG. 6.

Figure 6:
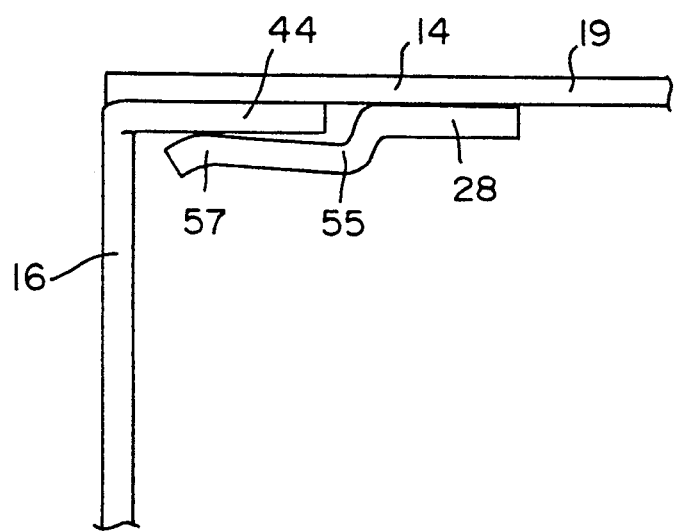
FIG. 6 illustrates a top spring channel lip engaging the upper front panel lip.

FIG. 6 illustrates frictional engagement of the top spring channel clip 28 of the cover 14 and the lip 44 of the front panel 16 where all numerals correspond to those elements previously described. The spring channel clip 28 is similar to the spring channel clip 24 and includes an inner bend 55 and a lip 57.

Figure 7:
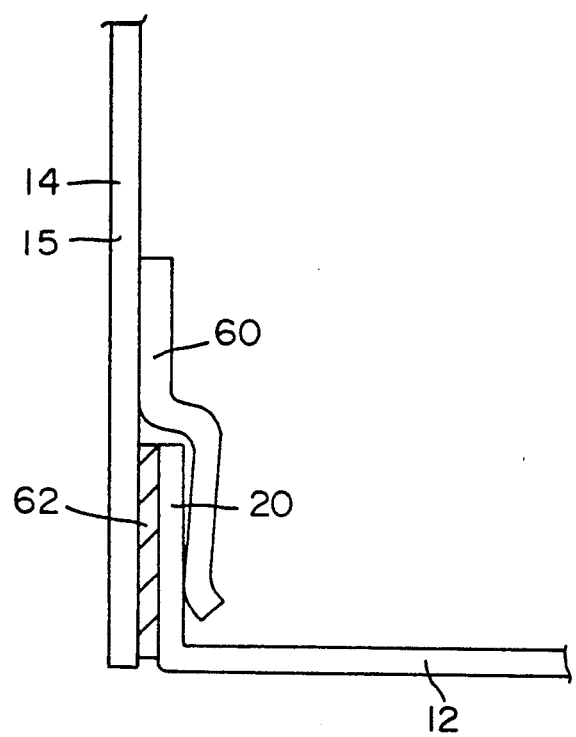
FIG. 7 illustrates an alternative embodiment of a base lip engaging a spring channel clip.

FIG. 7 illustrates an alternative embodiment showing frictional engagement of a spring channel clip 60 frictionally engaging the lip 20 for electrical and hermetic sealing of the base 12 with the cover 14 where all numerals correspond to those elements previously described. A flexible sealing gasket 62 is placed between the lip 20 and the side 15, and is held in place by spring pressure from the spring channel clip 60 to effect a hermetic seal between the lip 20 and the side 15. Electrical contact is maintained by contact of the spring channel clip 60, which, of course is electrically bonded to the cover 14 and the lip 20 of the base 12. The flexible sealing gasket 62 would, of course, be incorporated in the previously described spring channel clip engagement areas, as well as additional spring channel clips and lips at each edge where sealing is desired.

MODE OF OPERATION

Engagement of the lips 20 and 22 and the clips 24 and 26, and also of the lip 44 and the clip 28, is a tight-frictional engagement providing a electromagnetic seal between the cover 14 and the base 12. The electromagnetic seal provides mechanical connection, as well as electrical connection, for negating EMI and RFI transmissions generated internally within the housing of a personal computer, such as by the crystal oscillator, the mother board, and any other switching components, including the switching components of the power supply. Screw attachment of the rear of the cover 14 to the rear panel 18 of the base 12 securely interlocks the cover 14 and the base 12, preventing separation of the two metallic portions of the cabinet and preventing disturbance of the EMI and RFI seals by way of means short of gross distortion of the metallic elements thereof.

Various modifications can be made to the present invention without departing from the apparent scope hereof.

I Claim:

1. A personal computer housing made of material for negating EMI and RFI transmissions, comprising:
   a. a base including an integral rear panel and front panel, and first and second lips extending upwardly from opposing sides of said base; and,
   b. a cover for engaging between said front panel and said rear panel, having first and second sides for overlapping the first and second lips respectively, and including internal clips affixed inside the first and second sides for frictionally engaging with said first and second lips to hold the sides and lips in an overlapping relationship, whereby said engagement of said clips and said lips forms an electromechanical seal for negating leakage of EMI and RFI transmissions.

2. The housing of claim 1 further comprising a horizontally and integrally directed third lip mounted along a top of the front panel and a third clip mounted inside the cover for frictionally engaging the third lip.

3. A personal computer housing comprising:
   a. a base having upwardly extending lips on at least two opposing sides;
   b. a cover for mounting on the base having at least two downwardly directed sides for overlapping and mounting against the lips; and,
   c. clips mounted on the inside of the downwardly directed sides for frictionally engaging the lips and for holding the downwardly directed sides in overlapping relationship with the lips.

4. A personal computer housing of claim 3 wherein the clips are spring-channel clips extending along substantially the entire length of each side.

5. A personal computer housing comprising:
   a. a base having upwardly extending lips on at least two sides;
   b. a cover for mounting on the base having at least two downwardly directed sides for over-mounting and overlapping relationship over the lips; and,
   c. spring-channel clips mounted on the inside of the downwardly directed sides and extending for at least half of a length of each side for frictionally engaging the lips and for holding the sides in the overlapping relationship.

* * * * *